United States Patent
Lin et al.

(10) Patent No.: US 7,358,168 B2
(45) Date of Patent: Apr. 15, 2008

(54) ION IMPLANTATION METHOD FOR FORMING A SHALLOW JUNCTION

(75) Inventors: Chun Te Lin, Hsinchu (TW); Ta-Te Chen, Hsinchu (TW); Jen-Li Lo, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 250 days.

(21) Appl. No.: 10/921,027

(22) Filed: Aug. 17, 2004

(65) Prior Publication Data

US 2005/0255660 A1 Nov. 17, 2005

(30) Foreign Application Priority Data

May 17, 2004 (TW) .............................. 93113845 A

(51) Int. Cl.
  *H01L 21/24* (2006.01)
  *H01L 21/40* (2006.01)
(52) U.S. Cl. ................ 438/541; 438/305; 438/231
(58) Field of Classification Search ............... 438/231, 438/232, 305, 306, 541

See application file for complete search history.

(56) References Cited

U.S. PATENT DOCUMENTS

| | | | | |
|---|---|---|---|---|
| 4,532,697 A * | 8/1985 | Ko | ............................ | 438/305 |
| 4,683,645 A * | 8/1987 | Naguib et al. | ............... | 438/297 |
| 5,478,759 A * | 12/1995 | Mametani et al. | ........... | 438/228 |
| 5,648,673 A * | 7/1997 | Yasuda | ........................ | 257/382 |
| 5,872,047 A | 2/1999 | Lee et al. | | |
| 5,893,742 A * | 4/1999 | Demirlioglu et al. | ........ | 438/307 |
| 5,943,565 A * | 8/1999 | Ju | ............................... | 438/231 |
| 2001/0016338 A1 * | 8/2001 | Snapir et al. | .............. | 435/69.1 |
| 2001/0034102 A1 * | 10/2001 | Nitta | .......................... | 438/306 |
| 2001/0039094 A1 * | 11/2001 | Wristers et al. | ............. | 438/305 |
| 2002/0117634 A1 * | 8/2002 | Wilcox et al. | ........... | 250/492.1 |
| 2004/0224450 A1 * | 11/2004 | Itonaga et al. | .............. | 438/197 |
| 2007/0194376 A1 * | 8/2007 | Kim | ............................ | 257/336 |

* cited by examiner

*Primary Examiner*—Mary Wilczewski
*Assistant Examiner*—Seth Barnes
(74) *Attorney, Agent, or Firm*—Townsend and Townsend and Crew LLP

(57) ABSTRACT

A shallow junction that previously would require the use of a low-energy ion implanter can be directly formed by high-energy or middle-energy ion implanters such that the manufacturer need not purchase a new low-energy ion implanter. In one embodiment, an ion-implantation method for forming a shallow junction comprises providing a semiconductor substrate including at least one transistor structure. During ion implantation to form a shallow junction, a buffer layer is formed on the implantation region. The buffer layer has a predetermined thickness. Charged ions are implanted into the implantation region through the buffer layer by an energy provided by a middle-energy ion implanter, and the buffer layer is removed. The buffer layer is used for blocking the amount of the charged ions that will be implanted into the implantation region so as to form a shallow junction that would require a low-energy ion implanter without the buffer layer.

14 Claims, 12 Drawing Sheets

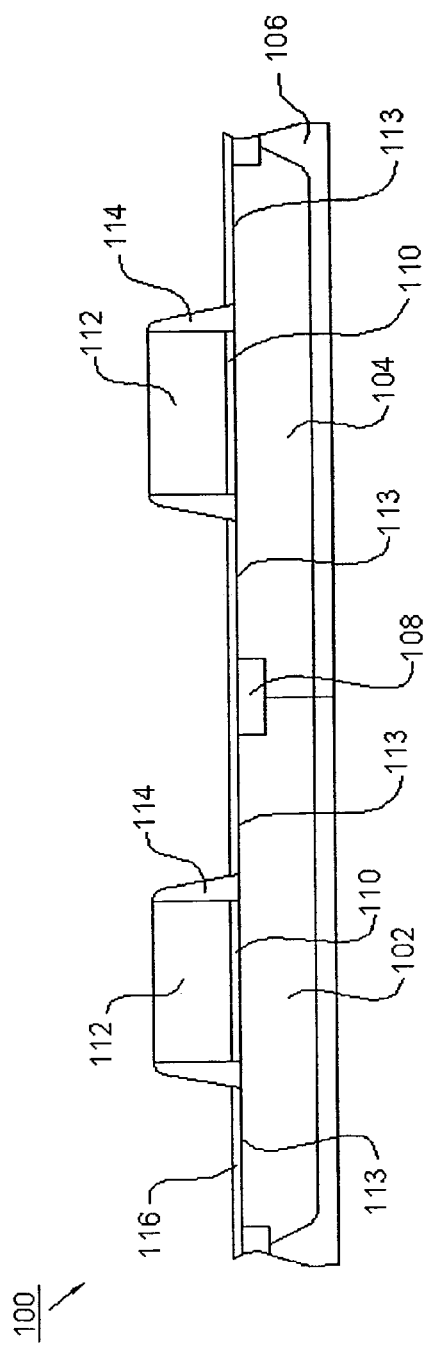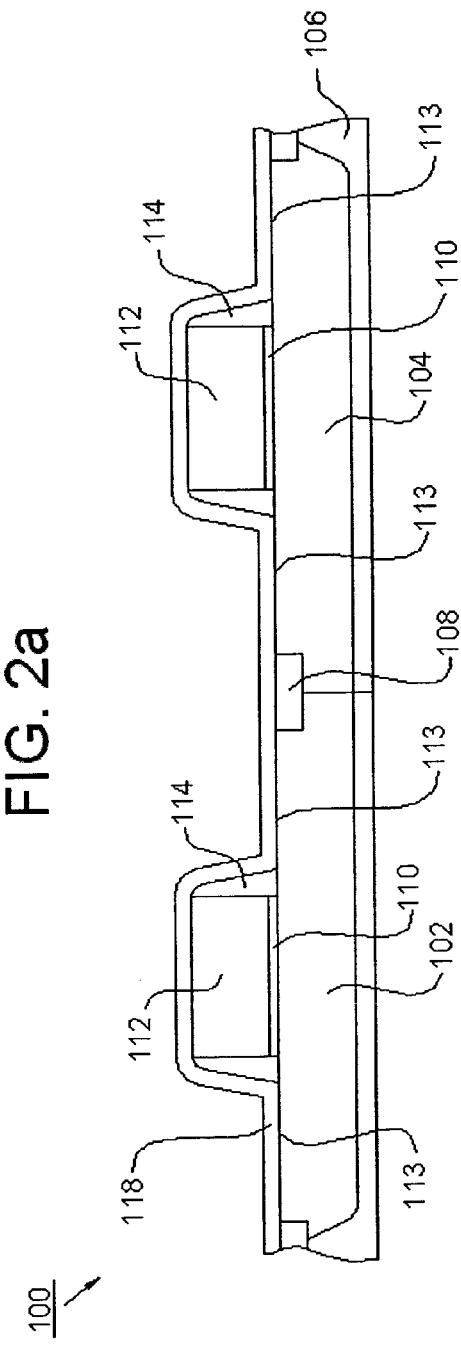

ION IMPLANTATION METHOD FOR FORMING A SHALLOW JUNCTION

CROSS-REFERENCES TO RELATED APPLICATIONS

This application claims priority from R.O.C. Patent Application No. 093113845, filed May 17, 2004, the entire disclosure of which is incorporated herein by reference.

BACKGROUND OF THE INVENTION

This invention generally relates to an ion-implantation method, and more particularly to an ion-implantation method for forming a shallow junction, which is used in the manufacture of electronic devices.

In semiconductor processing techniques, the ion implantation is a relatively significant technique. The ion implantation can alter the electrical properties of electronic devices so as to meet the performance requirements of the electronic devices.

Currently, ion implanters mainly include three types, namely, high-energy, middle-energy, and low-energy ion implanters. The high-energy ion implanter can provide energy of about several MeV (Mega-electron-Volt); the middle-energy ion implanter can provide energy of about 10 to 200 KeV (Kilo-electron-Volt); and the low-energy ion implanter can provide energy of about 1 KeV to several hundred eV, which can be found in U.S. Pat. No. 6,441,382 (referring to column 1, lines 35-50) and U.S. Pat. No. 6,452,196 (referring to column 1, lines 55-63). Since these ion implanters provide different implantation energy ranges, they have different designs in energy supply systems and thus form substantially different types of ion implanters.

The low-energy ion implanter has emerged as the preferred implanter for forming a shallow junction on integrated circuits, e.g., on the source/drain of transistors so as to reduce the leakage problem caused by the shrinkage of device size. Since a middle-energy ion implanter cannot be reconstructed as a low-energy ion implanter, generally manufacturers must purchase a new low-energy ion implanter. However, the low-energy ion implanter is very expensive. Therefore, under the condition that the manufacturer cannot purchase a new one, utilizing the high-energy or middle-energy ion implanter to achieve the object of forming a shallow junction has become a serious problem in ion-implantation processes.

BRIEF SUMMARY OF THE INVENTION

Embodiments of the present invention provide an ion-implantation method for forming a shallow junction, wherein a shallow junction that previously would require the use of a low-energy ion implanter can be directly formed by high-energy or middle-energy ion implanters such that the manufacturer need not purchase a new low-energy ion implanter.

In accordance with an aspect of the present invention, an ion-implantation method for forming a shallow junction comprises providing a semiconductor substrate including at least one transistor structure, and at least one transistor structure having at least one gate electrode and at least one implantation region for forming one of drain and source electrodes of the transistor structure thereon; forming an oxide layer on the transistor structure; etching the oxide layer to form at least one gate spacer on the at least one gate electrode; removing the oxide layer located on the at least one implantation region; forming a buffer layer on the at least one implantation region, the buffer layer having a predetermined thickness; implanting charged ions into the at least one implantation region through the buffer layer by an energy provided by a middle-energy ion implanter; and removing the buffer layer. The buffer layer is used for blocking the amount of the charged ions that will be implanted into the implantation region so as to form a shallow junction that would require a low-energy ion implanter without the buffer layer.

In accordance with another aspect of the invention, an ion-implantation method for forming a shallow junction comprises providing a semiconductor substrate including at least one implantation region; forming a buffer layer on the at least one implantation region, the buffer layer having a thickness smaller than about 750 Angstrom (Å); implanting charged ions into the implantation region through the buffer layer by an energy provided by a middle-energy ion implanter, wherein the middle-energy ion implanter provides an energy of about 10 to 200 KeV; and removing the buffer layer. The buffer layer is used for blocking the amount of the charged ions that will be implanted into the implantation region so as to form a shallow junction that would require a low-energy ion implanter without the buffer layer, wherein the low-energy ion implanter provides an energy less than about 1 KeV.

In accordance with another aspect of the invention, an ion-implantation method for forming a shallow junction comprises providing a semiconductor substrate including at least one electronic device having a buffer layer covering thereon wherein the buffer layer has a first buffer thickness; transferring the semiconductor substrate into a first ion implanter which provides a first range of ion-implantation energy; and implanting charged ions into the semiconductor substrate through a first ion-implantation energy. The first buffer thickness is selected by a determining process and the determining process utilizes at least two relations between shallow junction depth and ion-implantation energy. At least one relation between shallow junction depth and ion-implantation energy is obtained by a second ion implanter which provides a second range of ion-implantation energy and the second range of ion-implantation energy is smaller than and does not overlap with the first range of ion-implantation energy.

In specific embodiments, the method of the present invention can, according to a process flow design, deposit a buffer layer having a specific thickness on the implantation regions of a wafer before an ion-implantation process wherein the specific thickness is significant for the ion-implantation process.

BRIEF DESCRIPTION OF THE DRAWINGS

FIGS. 2a to 2g are schematic diagrams illustrating the application of the method for forming a shallow junction according to an embodiment of the present invention on a CMOS transistor.

DETAILED DESCRIPTION OF THE INVENTION

The embodiments described in this section illustrate but do not limit the invention. The invention is not limited to any specific circuit diagrams, layouts, materials, or dimensions. The invention is defined by the appended claims.

Figure 1:
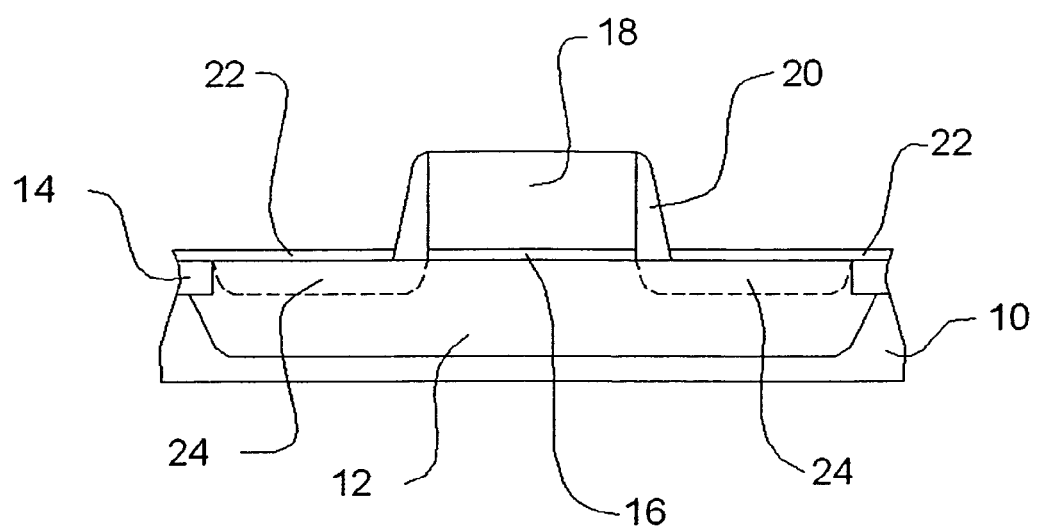
FIG. 1 is a schematic diagram illustrating a method for forming the source or drain junction of an electronic device.

FIG. 1 illustrates a method for forming the source or drain junction of an electronic device. The electronic device is formed on a semiconductor substrate 10 (e.g., monocrystalline silicon substrate). First, an N-type well 12 is formed on the semiconductor substrate 10, followed by the sequential formation of isolation trenches 14, a gate oxide layer 16, a gate electrode 18, and gate spacers 20. A residual oxide layer 22 is a residual layer after the formation of the gate spacers 20. The gate electrode 18 can serve as a mask for an ion-implantation process.

The ion-implantation process can be accomplished by an ion implanter (not shown). The ion implanter provides an energy for implanting P-type ions, e.g., boron (B), gallium (Ga) or indium (In) ions, to a predetermined depth in region 24 so as to form a P-type source/drain junction. Basically, the predetermined depth is usually determined by the amount of the energy provided by the ion implanter.

Figure 2C:
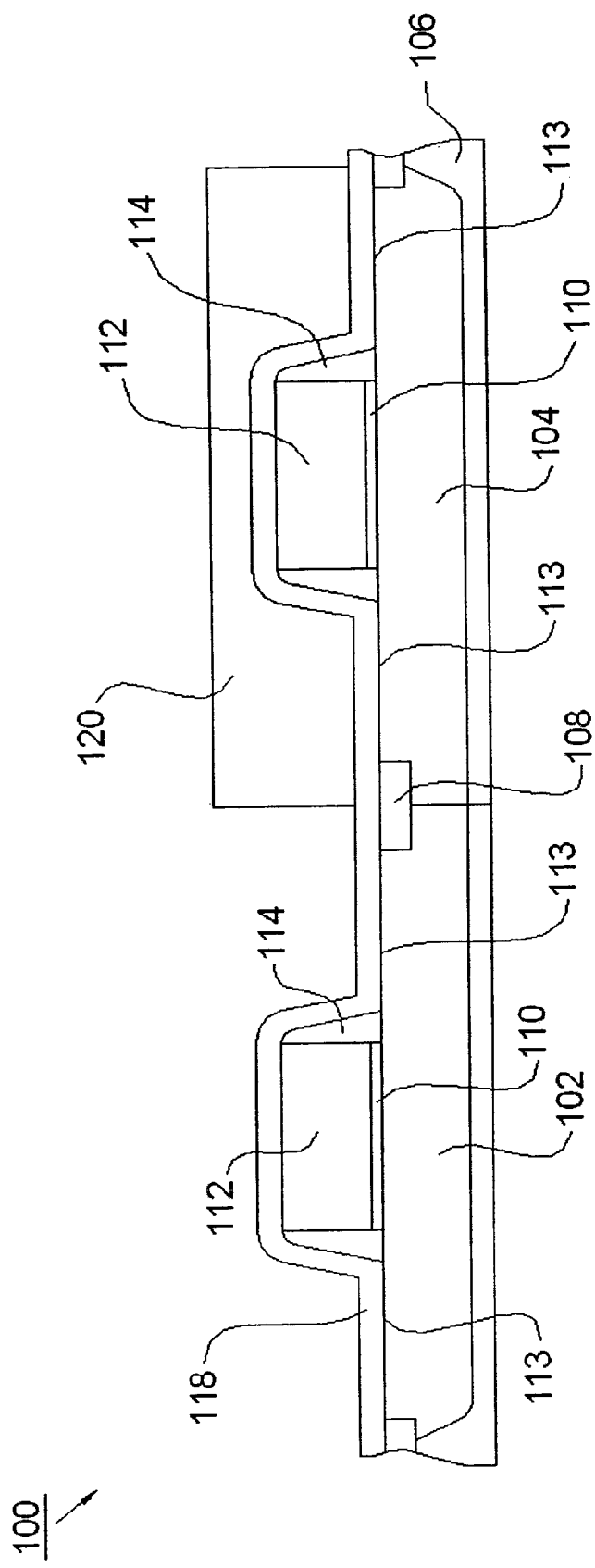

FIGS. 2a to 2g illustrate the application of the method for forming a shallow junction according to an embodiment of the present invention on a CMOS transistor 100. As shown in FIG. 2a, an N-type well 102 and a P-type well 104 are formed on a semiconductor substrate 106 (e.g., monocrystalline silicon substrate) and an isolation trench 108 is formed at the boundary between the N-type well 102 and the P-type well 104. The N-type well 102 and the P-type well 104 each have respectively a gate oxide layer 110 and a gate electrode 112 formed thereon. Implantation regions 113 are defined on both sides of each gate electrode 112. Gate spacers 114 are formed on the side walls of the gate electrode 112 and the gate oxide layer 110 by an etching process. A residual oxide layer 116 is a residual layer after the formation of the gate spacers 114. The structure shown in FIG. 2a can be obtained by conventional processes. FIGS. 2b to 2f illustrate the ion-implantation method for forming shallow source and drain junctions respectively in the N-type well 102 and the P-type well 104. In this embodiment, the term "shallow junction" means a junction that can only be directly accomplished by a low-energy ion implanter. In addition, the low-energy ion implanter means an ion implanter that can provide an energy lower than 1 KeV (Kilo-electron-Volt) and a middle-energy ion implanter, which will be described below, means an ion implanter that can provide an energy of about 10 to 200 KeV.

Figure 2D:
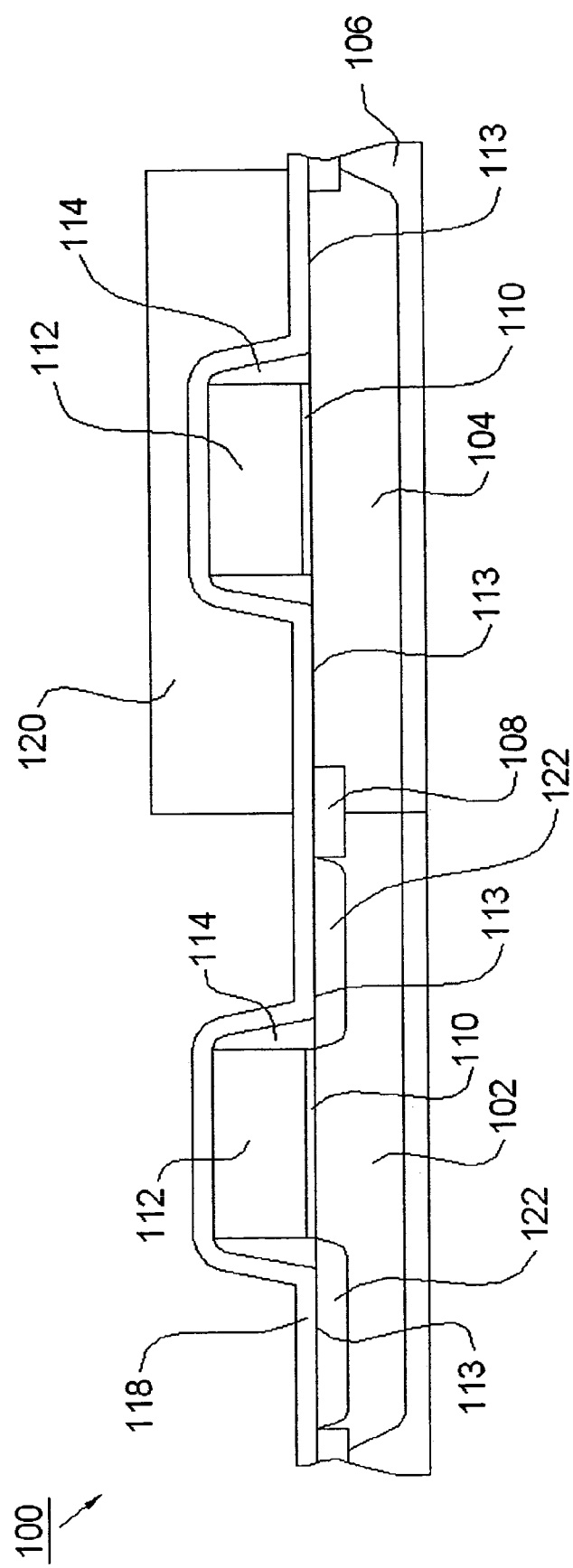

As shown in FIG. 2b, the residual oxide layer 116 is completely removed from the semiconductor substrate 106 by an etching process, and then a buffer layer 118 is formed on the above structure. Subsequently, as shown in FIG. 2c, a photoresist layer 120 is formed on the P-type well 104 and serves as a mask for an ion-implantation process while the gate electrode 112 on the N-type well 102 serves as another mask for the same ion-implantation process. As shown in FIG. 2d, the semiconductor substrate 106 is transferred into a middle-energy ion implanter (not shown), and charged ions, e.g., boron (B), gallium (Ga) or indium (In) ions are implanted into the implantation regions 113 by an energy (e.g., 20 KeV) provided by the middle-energy ion implanter (not shown) so as to form P-type source/drain junctions 122.

Figure 2E:
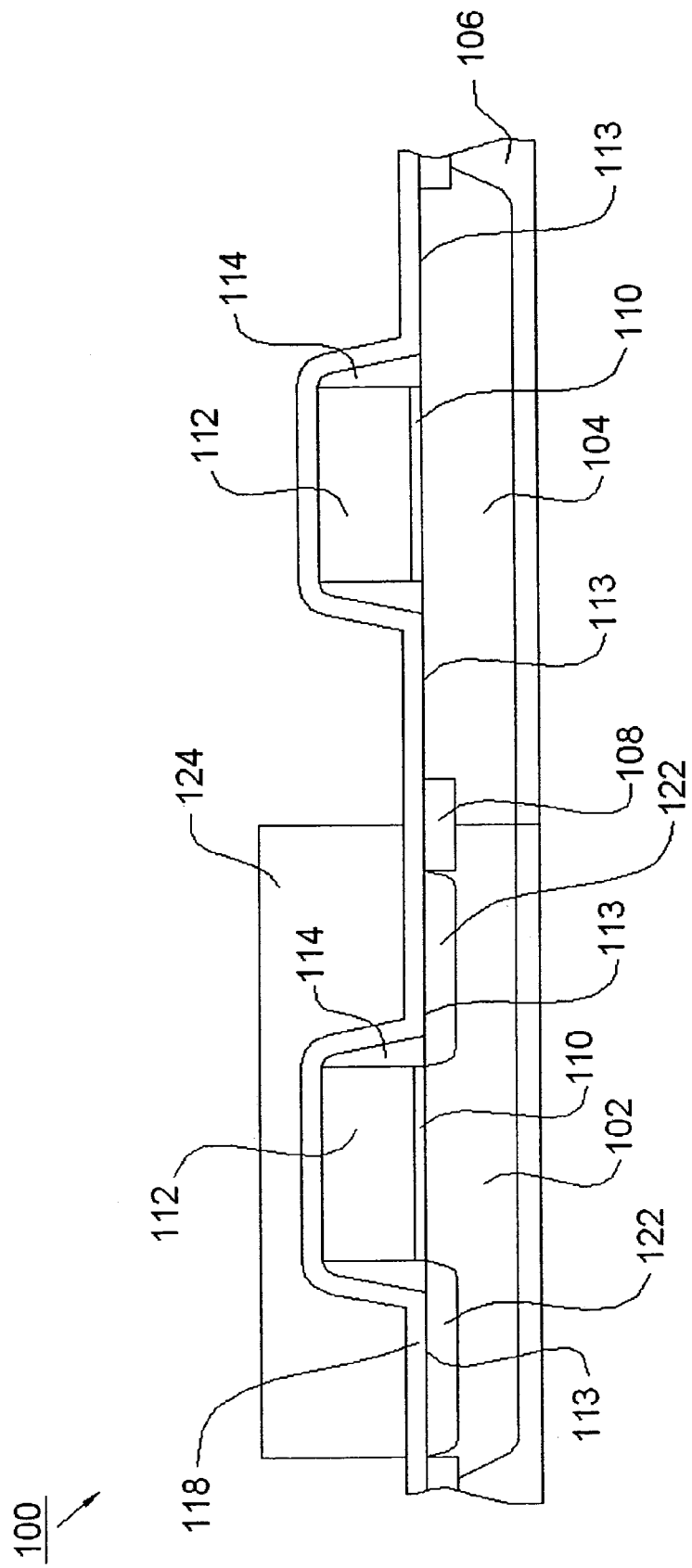
Figure 2F:
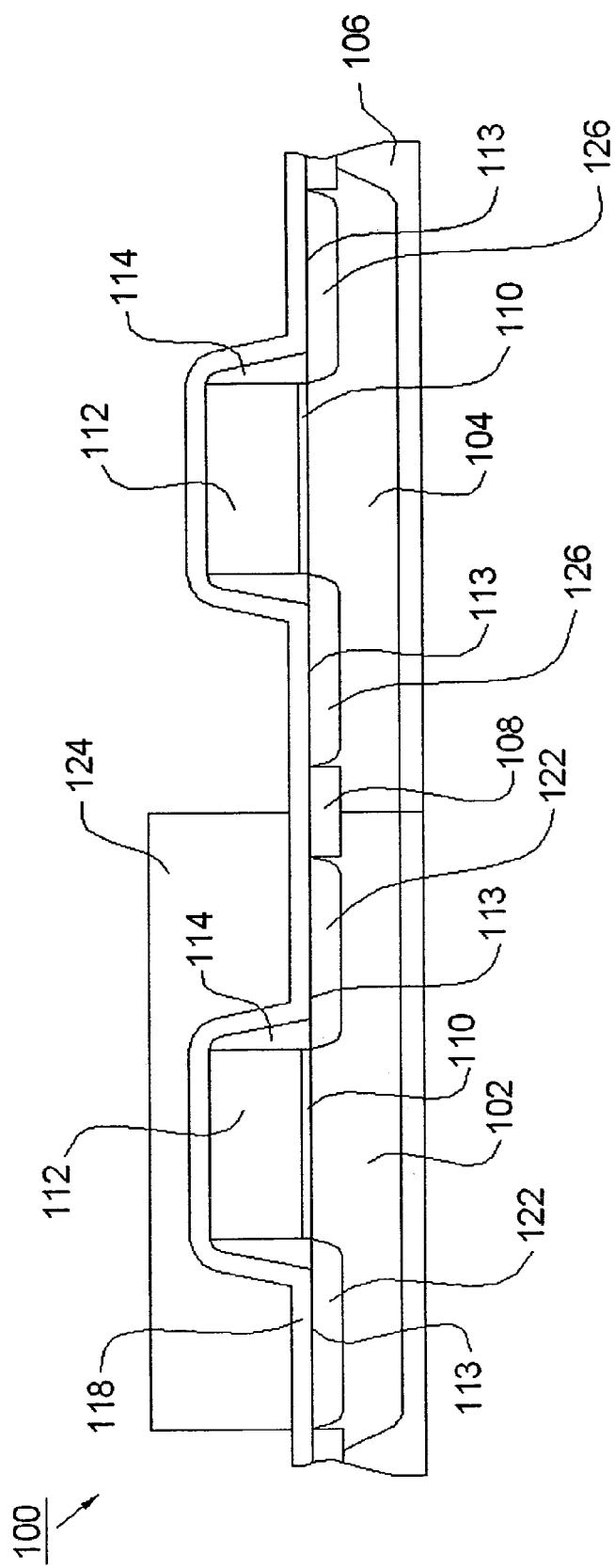
Figure 2G:
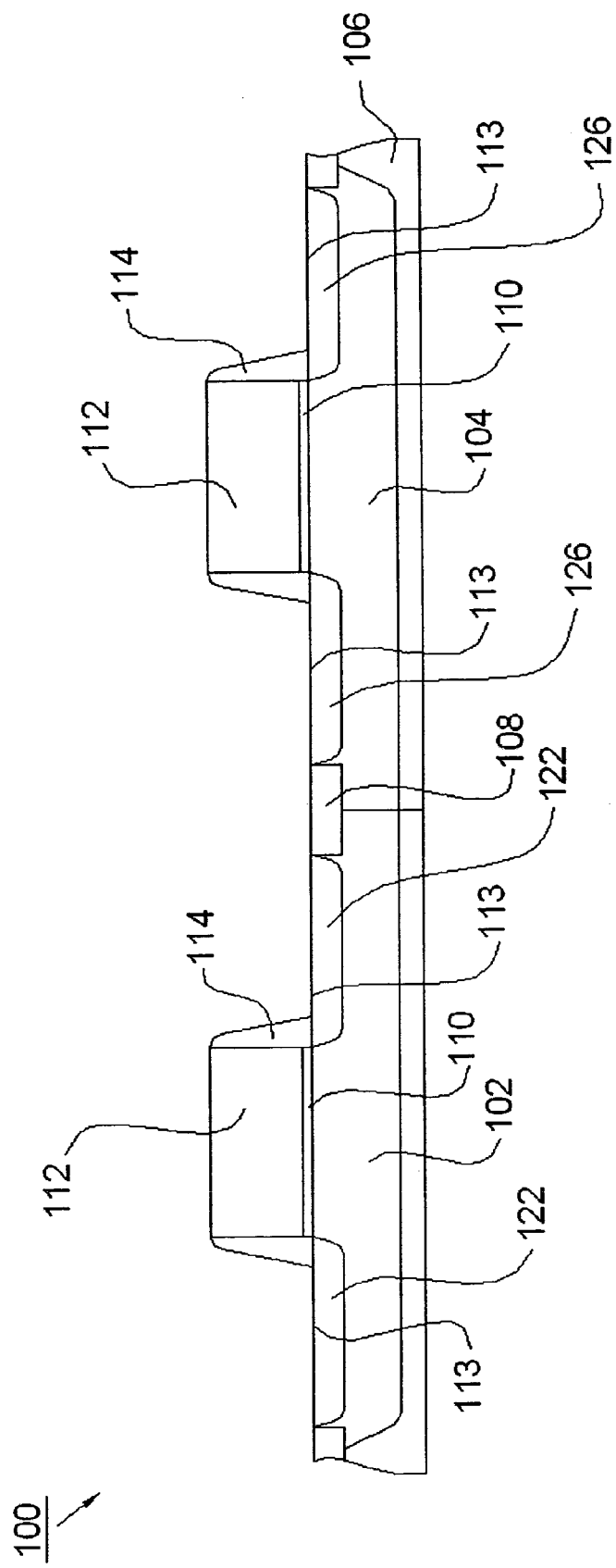
Figure 3:
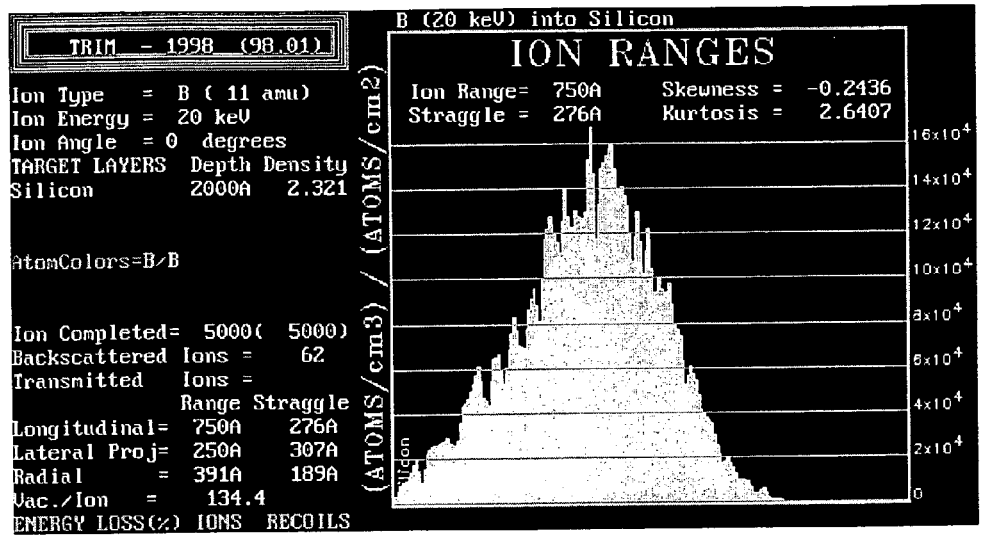
FIGS. 3 to 9 are result diagrams generated by simulation software wherein different energies are provided to implant boron (B) ions into a silicon substrate.
Figure 4:
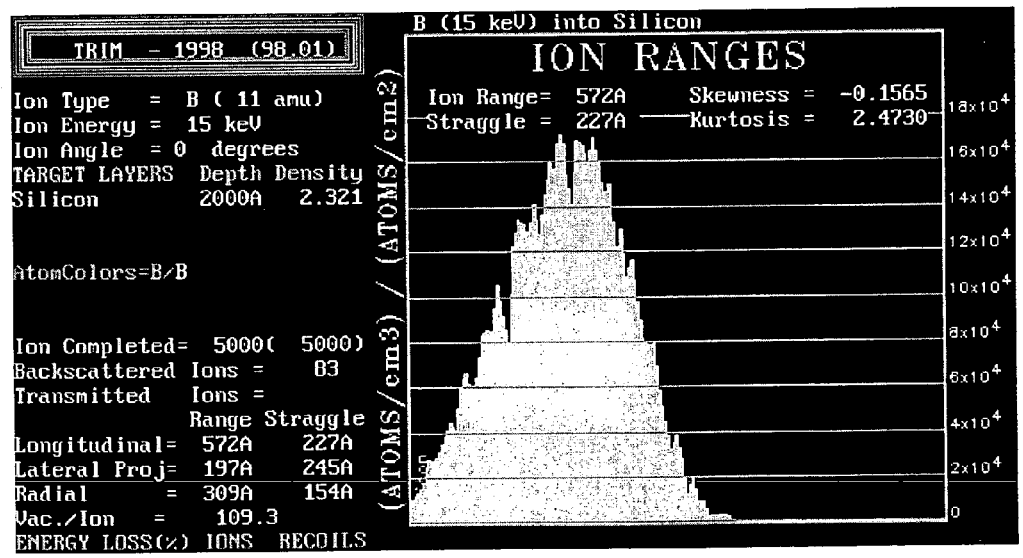
Figure 5:
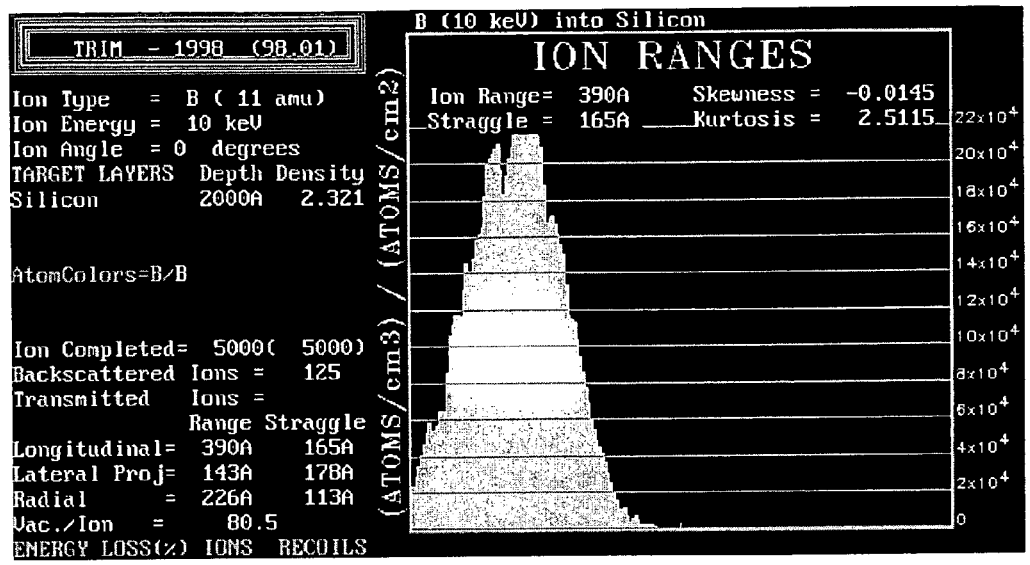
Figure 6:
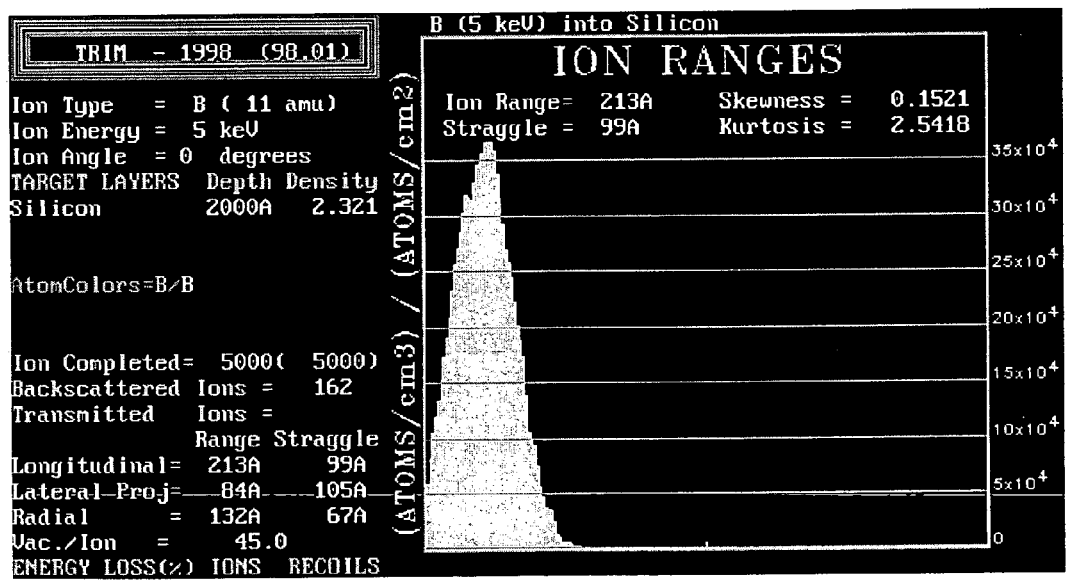

Subsequently, as shown in FIG. 2e, after the P-type source/drain junctions 122 are formed in the N-type well 102, the photoresist layer 120 is removed. Then, another photoresist layer 124 is formed on the N-type well 102 and serves as a mask for another ion-implantation process. Similarly, the gate electrode 112 on the P-type well 104 can also serve as another mask for the same ion-implantation process. Subsequently, as shown in FIG. 2f, other charged ions, e.g., phosphorum (P), arsenic (As) or antimony (Sb) are implanted into the implantation regions 113 by an energy (e.g., 20 KeV) provided by the middle-energy ion implanter (not shown) so as to form N-type source/drain junctions 126. Finally, as shown in FIG. 2g, the photoresist layer 124 and the buffer layer 118 are removed so as to accomplish the formation of the shallow source/drain junctions 122 and 126 in the N-type well 102 and the P-type well 104.

According to the above embodiment of the present invention, the buffer layer 118 has a predetermined thickness for blocking the amount of the charged ions that will be implanted into the implantation regions 113 by the middle-energy ion implanter, so as to reduce the junction depth in the region 113. Accordingly, the middle-energy ion implanter can form a shallow source/drain junction that otherwise would require the use of a low-energy ion implanter.

For example, if the structure as shown in FIG. 2a is directly implanted with ions for forming the source/drain junctions, the source/drain junctions formed by an energy of 20 KeV might have a junction depth of about 750 Angstrom. However, according to the ion-implantation of the present embodiment, since the buffer layer 118 can block the amount of charged ions, the source/drain junctions formed by the same energy of 20 KeV will have another junction depth of smaller than 750 Angstrom, which might be achieved by an energy of 15 KeV without the use of the buffer layer.

It should be noted that the ion-implantation method of the present embodiment could be applied to form shallow junctions on many kinds of electronic devices, e.g., power devices or diodes. In addition, the buffer layer 118 could be any material that does not react with the layer thereunder and is easy to remove. In one embodiment of the present invention, the buffer layer 118 is an oxide layer (e.g., SiO2). Further, in some embodiments of the present invention, the charged ions could also be generated in different environments with inert gases, e.g., argon (Ar) and nitrogen (N), depending on the particular processes.

FIGS. 3 to 9 are result diagrams from simulations using the TRIM (Transfer of Ions in Matter) simulation software in which different energies are provided to implant boron (B) ions into a silicon substrate. The horizontal coordinate of each diagram indicates the implantation depth of the boron ions and the vertical coordinate indicates the implanted amount of the boron ions. Table 1 summarizes the results of FIGS. 3 to 9.

TABLE 1

| Implantation Energy (KeV) | Buffer Layer Thickness (Å) | Implantation Depth (silicon substrate + buffer layer) (Å) | Implantation Depth (silicon substrate) (Å) |
|---|---|---|---|
| 20 | 0 | 750 | 750 |
| 15 | 0 | 572 | 572 |
| 10 | 0 | 390 | 390 |
| 5 | 0 | 213 | 213 |
| 20 | 190 | 761 | 571 |
| 20 | 385 | 778 | 393 |
| 20 | 575 | 786 | 211 |

Figure 7:
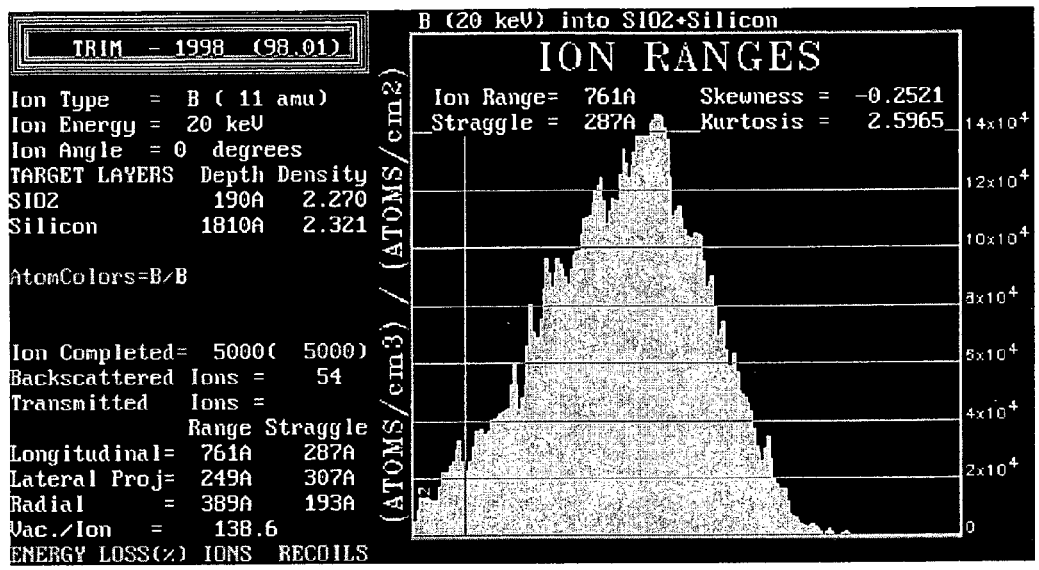
Figure 8:
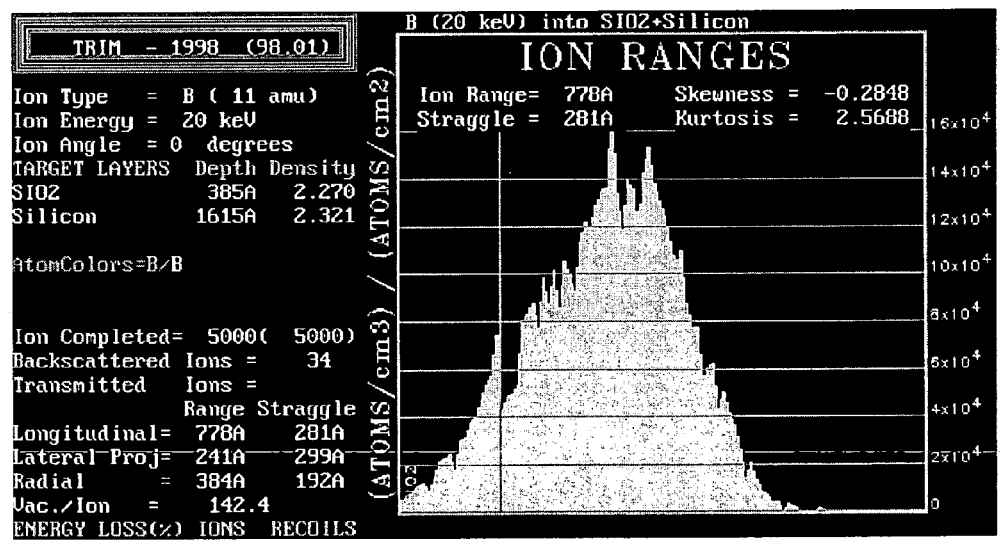
Figure 9:
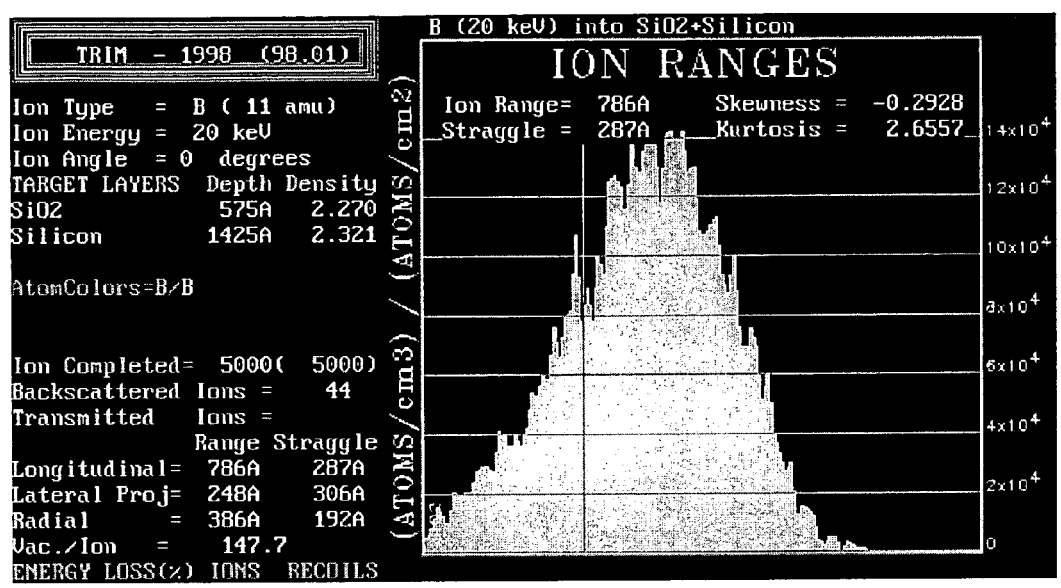

FIGS. 3 to 6 show the respective results of the implantation of the boron ions into a silicon substrate without a buffer layer by respective energies of 20 KeV, 15 KeV, 10 KeV, and 5 KeV. FIGS. 7 to 9 show the respective results of the implantation of the boron ions into a silicon substrate with a buffer layer, each having a specific thickness, by an energy of 20 KeV.

It should be understood by Table 1 that when the implantation energies are respectively 20 KeV, 15 KeV, 10 KeV, and 5 KeV and the thickness of the buffer layer on the silicon substrate is 0 Å, the implantation depths of the boron ions in the silicon substrate are respectively 750 Å, 572 Å, 390 Å, and 213 Å. However, when the implantation energy is 20 KeV and the thicknesses of the buffer layers on the silicon substrate are respectively 190 Å, 385 Å, and 575 Å, the implantation depths of the boron ions in the silicon substrate are respectively 571 Å, 393 Å and 211 Å.

Apparently, when the silicon substrate has buffer layers with respective thickness of 190 Å, 385 Å, and 575 Å formed thereon, the implantation depths (571 Å, 393 Å, and 211 Å) achieved by the energy of 20 KeV are substantially equal to those (572 Å, 390 Å, and 213 Å) achieved by the energies of 15 KeV, 10 KeV, and 5 KeV. Accordingly, if the implantation depth which should be achieved by an energy of 1 KeV (or smaller) will be formed, the buffer layer should be thicker. Therefore, the ion-implantation method of the present embodiment can, through the formation of a buffer layer, utilize a middle-energy ion implanter to form a shallow junction which would require by a low-energy ion implanter without a buffer layer, such that manufacturers need not purchase a new low-energy ion implanter.

Figure 10:
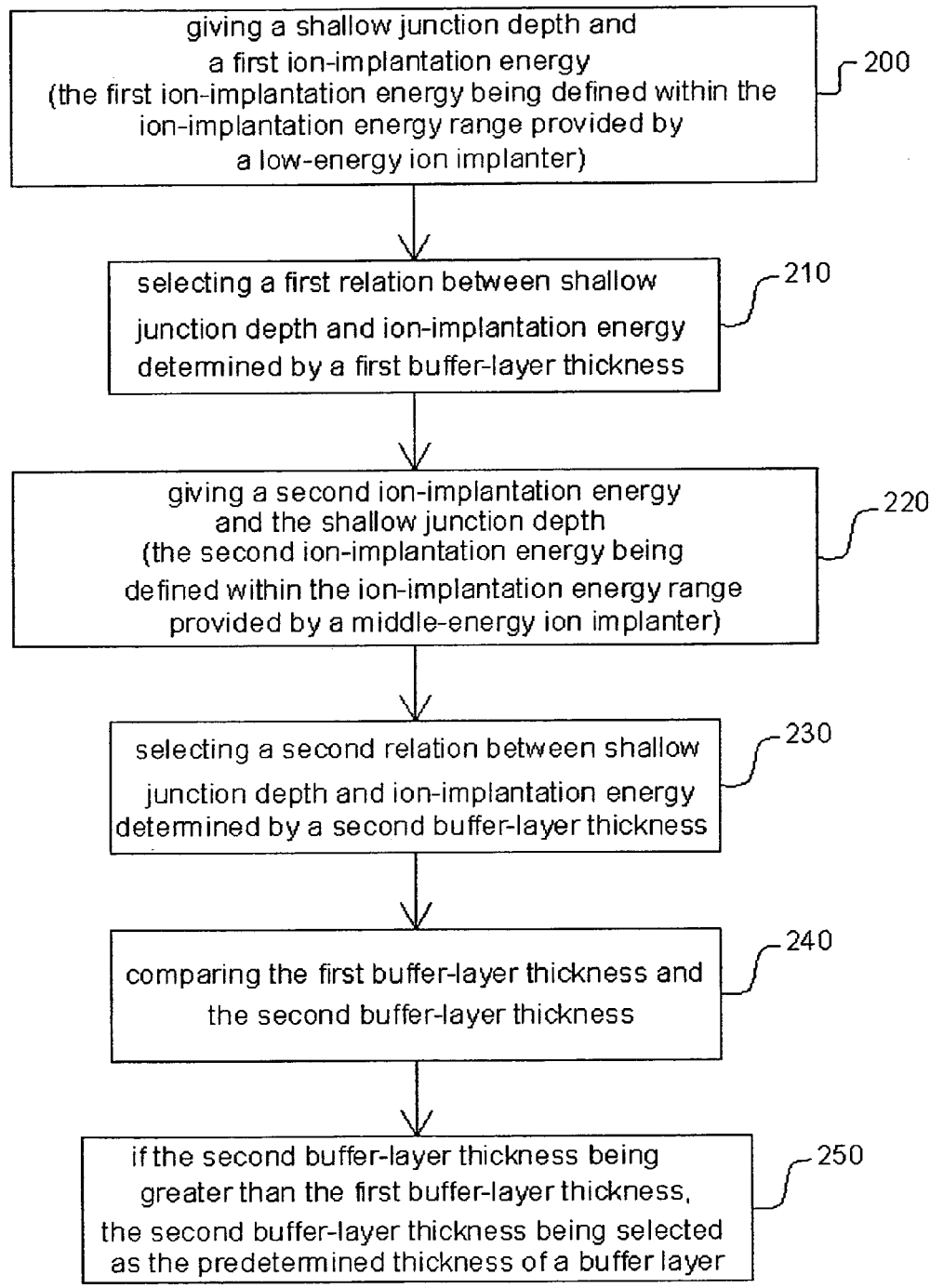
FIG. 10 is a determining-process flowchart for selecting a predetermined thickness of a buffer layer.

The predetermined thickness of the buffer layer according to the present embodiment can be selected by a determining process of which the flowchart is shown in FIG. 10. The determining process comprises the steps of: giving a shallow junction depth and a first ion-implantation energy wherein the first ion-implantation energy is defined within the ion-implantation energy range provided by a low-energy ion implanter (step 200); selecting a first relation between shallow junction depth and ion-implantation energy by the shallow junction depth and the first ion-implantation energy wherein the first relation between shallow junction depth and ion-implantation energy is determined by a first buffer-layer thickness (step 210); giving a second ion-implantation energy and the shallow junction depth wherein the second ion-implantation energy is defined within the ion-implantation energy range provided by a middle-energy ion implanter (step 220); selecting a second relation between shallow junction depth and ion-implantation energy by the shallow junction depth and the second ion-implantation energy wherein the second relation between shallow junction depth and ion-implantation energy is determined by a second buffer-layer thickness (step 230); comparing the first buffer-layer thickness and the second buffer-layer thickness (step 240); and if the second buffer-layer thickness is greater than the first buffer-layer thickness, selecting the second buffer-layer thickness as the predetermined thickness of a buffer layer (step 250); wherein the first relation between shallow junction depth and ion-implantation energy is obtained by the low-energy ion implanter and the second relation between shallow junction depth and ion-implantation energy is obtained by the middle-energy ion implanter.

Moreover, the present invention can be applied to:

(a) basic CMOS processes, e.g., adjusting the threshold voltage of transistors, forming N-type, P-type wells and isolation of transistors, forming source and drain electrodes of transistors, forming low-doping-concentration drains electrode, suppressing the breakdown between drain and source electrodes; doping polysilicon and collecting impurities;

(b) advanced processes, e.g., forming ultra-shallow source and drain electrodes or extension thereof; and (c) other processes, e.g., shallow trench implantations and formations of a thin silicon film on a isolated substrate.

In addition, a same or similar method can also be applied to a high-energy ion implanter.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An ion-implantation method for forming a shallow junction, comprising:
    providing a semiconductor substrate including at least one transistor structure, and at least one transistor structure having at least one gate electrode and at least one implantation region for forming one of drain and source electrodes of the transistor structure thereon;
    forming an oxide layer on the transistor structure;
    etching the oxide layer to form at least one gate spacer on the at least one gate electrode;
    removing the oxide layer located on the at least one implantation region;
    forming a buffer layer on the at least one implantation region and the at least one gate spacer, the buffer layer having a predetermined thickness;
    implanting charged ions into the at least one implantation region through the buffer layer by an energy provided by a middle-energy ion implanter; and
    removing the buffer layer over the at least one implantation region and the at least one gate spacer.

2. The ion-implantation method of claim 1, wherein the middle-energy ion implanter provides energy of about 10 to 200 KeV.

3. The ion-implantation method of claim 1, wherein the predetermined thickness of the buffer layer is smaller than about 750 Angstrom (Å).

4. The ion-implantation method of claim 1, wherein the buffer layer comprises a $SiO_2$ layer.

5. The ion-implantation method of claim 1, wherein the charged ions are selected from the group consisting of phosphorum (P), arsenic (As), and antimony (Sb) ions.

6. The ion-implantation method of claim 1, wherein the charged ions are selected from the group consisting of boron (B), gallium (Ga), and indium (In) ions.

7. The ion-implantation method of claim 1, wherein the charged ions are generated in inert gases.

8. An ion-implantation method for forming a shallow junction comprising:
    providing a semiconductor substrate including at least one implantation region and one gate electrode;
    forming at least one gate spacer on the at least one gate electrode;
    forming a buffer layer on the at least one implantation region and the at least one gate spacer, the buffer layer having a thickness smaller than about 750 Angstrom (Å);
    implanting charged ions into the implantation region through the buffer layer by an energy provided by a middle-energy ion implanter, wherein the middle-energy ion implanter provides an energy of about 10 to 200 KeV; and
    removing the buffer layer over the at least one implantation region and the at least one gate spacer.

9. The ion-implantation method of claim 8, wherein the buffer layer comprises an oxide layer.

10. The ion-implantation method of claim 9, wherein the oxide layer is a $SiO_2$ layer.

11. The ion-implantation method of claim 8, wherein the charged ions are selected from the group consisting of phosphorum (P), arsenic (As), and antimony (Sb) ions.

12. The ion-implantation method of claim 8, wherein the charged ions are selected from the group consisting of boron (B), gallium (Ga), and indium (In) ions.

13. The ion-implantation method of claim 8, wherein the implantation region is used for forming one of drain and source electrodes of a transistor structure thereon.

14. The ion-implantation method of claim 8, wherein the charged ions are generated in inert gases.

* * * * *